(12) United States Patent
Kim

(10) Patent No.: US 8,789,266 B2
(45) Date of Patent: Jul. 29, 2014

(54) APPARATUS FOR PLACING ELECTRONIC PARTS

(75) Inventor: Seong-Ku Kim, Seongnam-si (KR)

(73) Assignee: Samsung Techwin Co., Ltd., Changwon-Si (KR)

( * ) Notice: Subject to any disclaimer, the term of this patent is extended or adjusted under 35 U.S.C. 154(b) by 195 days.

(21) Appl. No.: 12/841,736

(22) Filed: Jul. 22, 2010

(65) Prior Publication Data

US 2011/0030200 A1   Feb. 10, 2011

(30) Foreign Application Priority Data

Aug. 4, 2009   (KR) .................. 10-2009-0071635

(51) Int. Cl.
*B23P 19/00* (2006.01)

(52) U.S. Cl.
USPC .................. 29/740; 29/721; 29/739; 29/759; 294/185

(58) Field of Classification Search
CPC .............. H05K 13/02; H05K 13/0413; H05K 13/0061; H05K 13/0408; H05K 13/0478; H01L 2224/75; H01L 2224/75743; H01L 2924/01087; H01L 21/67132; H01L 21/67144; H01L 21/6838
USPC ............ 29/729, 739, 740–743, 759; 414/737, 414/752.1–752.2; 901/40; 294/64.1, 185
See application file for complete search history.

(56) References Cited

U.S. PATENT DOCUMENTS

| | | | | | |
|---|---|---|---|---|---|
| 4,999,909 | A | * | 3/1991 | Eguchi et al. | 29/740 |
| 5,153,983 | A | | 10/1992 | Oyama | |
| 5,155,903 | A | * | 10/1992 | Nakashima et al. | 29/832 |
| 5,740,604 | A | * | 4/1998 | Kitamura et al. | 29/832 |
| 5,979,045 | A | * | 11/1999 | Nishimori et al. | 29/832 |
| 6,195,878 | B1 | * | 3/2001 | Hata et al. | 29/832 |
| 6,257,391 | B1 | * | 7/2001 | Nishimori et al. | 29/832 |
| 6,390,281 | B1 | * | 5/2002 | Nagai et al. | 29/740 |
| 6,920,687 | B2 | * | 7/2005 | Nakano et al. | 29/832 |
| 7,246,429 | B2 | * | 7/2007 | Oyama | 29/740 |
| 7,493,689 | B2 | * | 2/2009 | Ricketson | 29/739 |
| 8,359,735 | B2 | * | 1/2013 | Ban et al. | 29/740 |

FOREIGN PATENT DOCUMENTS

| | | |
|---|---|---|
| JP | 61-171564 A | 8/1986 |
| JP | 9-001354 A | 1/1997 |
| JP | 11-103198 A | 4/1999 |
| JP | 2001-168583 A | 6/2001 |

(Continued)

OTHER PUBLICATIONS

Communication dated Apr. 2, 2013, issued by the State Intellectual Property Office of the People's Republic of China in counterpart Chinese Patent Application No. 201010246228.0.

*Primary Examiner* — Minh Trinh
(74) *Attorney, Agent, or Firm* — Sughrue Mion, PLLC

(57) ABSTRACT

An apparatus for manufacturing electronic parts is provided. The apparatus includes a head unit installed on a main body and configured to move up and down, a nozzle unit installed on the head unit and configured to move up and down, and a positioning unit sequentially displacing the head unit and the nozzle unit to a position where the electronic parts are on standby to suction the electronic parts using the nozzle unit. Thus, when the head unit is used to suction the electronic parts on standby at a standby position of the electronic parts, the head unit and the nozzle unit installed on the head unit are sequentially lowered, so that it is possible to relieve an impact occurring when the electronic parts are suctioned to the ends of nozzles.

18 Claims, 10 Drawing Sheets

(56) References Cited

FOREIGN PATENT DOCUMENTS

| | | | |
|---|---|---|---|
| JP | 2007-096238 | A | 4/2007 |
| KR | 1995-0023266 | A | 7/1995 |
| KR | 1998-019581 | A | 6/1998 |
| KR | 1999-0040819 | A | 6/1999 |
| KR | 10-2007-0035866 | A | 4/2007 |

* cited by examiner

APPARATUS FOR PLACING ELECTRONIC PARTS

CROSS-REFERENCE TO RELATED PATENT APPLICATION

This application claims priority from Korean Patent Application No. 10-2009-0071635, filed on Aug. 4, 2009, the disclosure of which is incorporated herein in its entirety by reference.

BACKGROUND

1. Field

Apparatuses consistent with the present inventive concept relate to manufacturing electronic parts, in which, when a head unit is used to suction the electronic parts on standby at a standby position of the electronic parts, the head unit and a nozzle unit installed on the head unit are sequentially lowered, thereby making it possible to relieve an impact occurring when the electronic parts are suctioned to ends of nozzles.

2. Description of Related Art

In general, a chip mounter, an apparatus for manufacturing electronic parts, is used to mount electronic parts such as a semiconductor device package on a printed circuit board (PCB).

Such a chip mounter includes a head assembly. The head assembly includes a plurality of nozzles, each of which is raised or lowered by, for instance, a motor installed on the head assembly. The head assembly is displaced to allow the nozzles to be transferred to a predetermined position by a transfer unit.

A lift mechanism of the nozzles, which is used in the head assembly, is configured to install the nozzles on respective transfer belts, support opposite ends of each transfer belt through a pair of rollers, and drive a motor connected to one of the rollers.

Thus, when the motor rotates forward or backward, the nozzles are raised or lowered along the transfer belts alternately moving in an upward or downward direction.

Since, however, the nozzles are installed on the transfer belts in a one-to-one relationship, i.e., one nozzle for one transfer belt, a quantity of the electronic parts which are suctioned is small, which results in reduced productivity. Furthermore, the nozzles are lowered all together at a same time to suction the electronic parts, so that an amount of impact which is applied to the electronic parts by ends of the nozzles is increased, and in the worst case, the electronic parts are damaged.

In addition, the head assembly includes a mirror at a lower end of each nozzle. The mirror reflects images of the electronic parts, which are suctioned to the nozzles, toward an image processing apparatus so as to check positions of the electronic parts using the images.

However, when the nozzles are lowered, the mirror is configured to be put from the nozzles to one side using a separate motor. As such, when the motor is subject to malfunction, this malfunction is not immediately recognized, and thus, the mirror collides with the lowered nozzles.

Further, when the mirror is rotated to deviate from the nozzles or to return to its original position, whether the mirror normally deviates from the nozzles or returns to its original position is not monitored. Thus, any abnormal deviation or return of the mirror may not be corrected in real time. As such, the apparatus may not avoid a possible damage due to collision between the mirror and the nozzles.

SUMMARY

Exemplary embodiments provide an apparatus for manufacturing electronic parts, in which, when a head unit is used to suction the electronic parts on standby at a standby position of the electronic parts, the head unit and a nozzle unit installed on the head unit are sequentially lowered, thereby making it possible to relieve an impact occurring when the electronic parts are suctioned to ends of nozzles of the nozzle unit.

Exemplary embodiments also provide an apparatus for manufacturing electronic parts, in which upward or downward movement of a head unit and a nozzle unit installed on the head unit is capable of cooperating with movement of at least one mirror located below the nozzles to the standby or operating position.

Exemplary embodiments are directed to an apparatus for manufacturing electronic parts. The apparatus includes a main body, a head unit installed on the main body and configured to move up and down, a nozzle unit installed on the head unit and configured to move up and down, and a positioning unit sequentially displacing the head unit and the nozzle unit to a position where the electronic parts are on standby to suction the electronic parts using the nozzle unit.

The head unit may include a head unit body having a nozzle unit installation space in which the nozzle unit is installed and an opening exposing the nozzle unit in a downward direction, and a connecting member connecting the head unit body to the main body.

The nozzle unit may include a plurality of nozzles disposed in the nozzle unit installation space at predetermined intervals, a plurality of rotary belts connected with the plurality of nozzles and installed upright such that the plurality of nozzles move up and down, and a plurality of pairs of rollers, each pair supporting opposite ends of a respective rotary belt of the plurality of rotary belts.

Each of the plurality of rotary belts is connected with a pair of nozzles among the plurality of nozzles moving together on two axes, and the pair of nozzles are installed on the each rotary belt to be opposite to each other.

The positioning unit may include a first motor that is installed on the main body and is connected to one end of the connecting member, a second motor that is connected with one of the each pair of the plurality of rollers, and a controller that is electrically connected with the first and second motors and sequentially drives the first and second motors.

The controller may be configured to preset a standby position level of the electronic parts, displacement levels of the head unit, and displacement levels of the nozzle unit. The displacement levels of the head unit may be upward and downward movement position levels of the head unit, and the displacement levels of the nozzle unit may be upward and downward movement position levels of the nozzle unit.

The controller may drive the first and second motors to lower the head unit and the nozzle unit to the downward movement position levels of the head unit and the nozzle unit, respectively, such that ends of the pair of nozzles reach the standby position level.

The controller may drive the first and second motors to adjust the head unit to the downward movement position level of the head unit and then the nozzle unit to the upward movement position level of the nozzle unit such that the ends of the pair of nozzles reach the standby position level.

When the pair of nozzles move together on the two axes, the controller may control the second motor to rotate in a forward or backward direction such that the pair of nozzles reach the downward movement position level of the nozzle unit on alternate axes.

The positioning unit may be connected with a vacuum supply supplying a vacuum suction force for suctioning the electronic parts using the plurality of nozzles of the nozzle unit, and the controller may operate the vacuum supply when the ends of the pair of nozzles reach the standby position level.

The head unit body may further include a cam member on a lateral portion thereof which has a predetermined length in a direction where the head unit body moves up and down.

The main body may include a mirror unit that is hinged to the main body at one end thereof and has at least one mirror at the other end thereof. The mirror may be located at or deviate from a position located below a lower portion of the nozzle unit as the head unit body moves upward or downward.

The mirror unit may include a driven member coming into close contact with one face of the cam member.

When the head unit body is lowered, the driven member may be pushed to one side in close contact with one face of the cam member such that the mirror unit deviates from the position located below the lower portion of the nozzle unit.

The driven member may be a roller rotatably installed on the mirror unit, and one face of the cam member is formed such that a width thereof is reduced in a direction where the head unit is lowered. The main body may include a movement path of a central shaft of the roller formed along a rotational path of the mirror, and the mirror unit may be connected with a predetermined part of the main body and is returned to an original position thereof.

One face of the cam member may include a first face at which the cam member has a first width, a second face at which the cam member has a second width smaller than the first width, and an inclined face interconnecting the first face and the second face, wherein the roller contacts the first face when the roller is pushed to one side of the cam member and contacts the second face when the roller returns to an initial position.

The head unit body may further include a cam member on a lateral portion thereof, the cam member having a predetermined length in a direction where the head unit body moves up and down and gear teeth formed on one face thereof. The main body may include a mirror unit that is hinged to the main body at one end thereof and has at least one mirror at the other end thereof. The mirror may be located at or deviate from a lower portion of the nozzle unit as the head unit body moves upward or downward. The mirror unit may be engaged with the one face of the cam member at one end thereof, and may be rotated to deviate from the position located below the lower portion of the nozzle unit in engagement with the one face of the cam member moving downward when the head unit body is lowered.

The main body may include an image acquisition unit that acquires an image reflected from an electronic part among the electronic parts suctioned to an end of one of the pair of nozzles through the mirror and sends the acquired images to the controller. The controller may compare the sent image of the electronic part with a preset image of the electronic part, determines whether an area of the electronic part which is suctioned to the end of one of the pair of nozzles matches with the preset image, stops driving the first and second motors if the area of the electronic part which is suctioned to the end of one of the pair of nozzles and the preset image are different from each other.

The apparatus for manufacturing the electronic parts may further include a rotational angle detection sensor detecting a rotational angle of the mirror unit, and a third motor controlled by the controller. The controller may be configured to preset an open rotational angle when the mirror deviates from the position located below the lower portion of the nozzle unit and a closed rotational angle when the mirror is located at the position below the lower portion of the nozzle unit. The controller may control operation of the third motor such that a rotational angle detected when the mirror deviates from the lower portion of the nozzle unit is equal to the open rotational angle, and such that another rotational angle detected when the mirror is located at the position below the lower portion of the nozzle unit is equal to the closed rotational angle.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
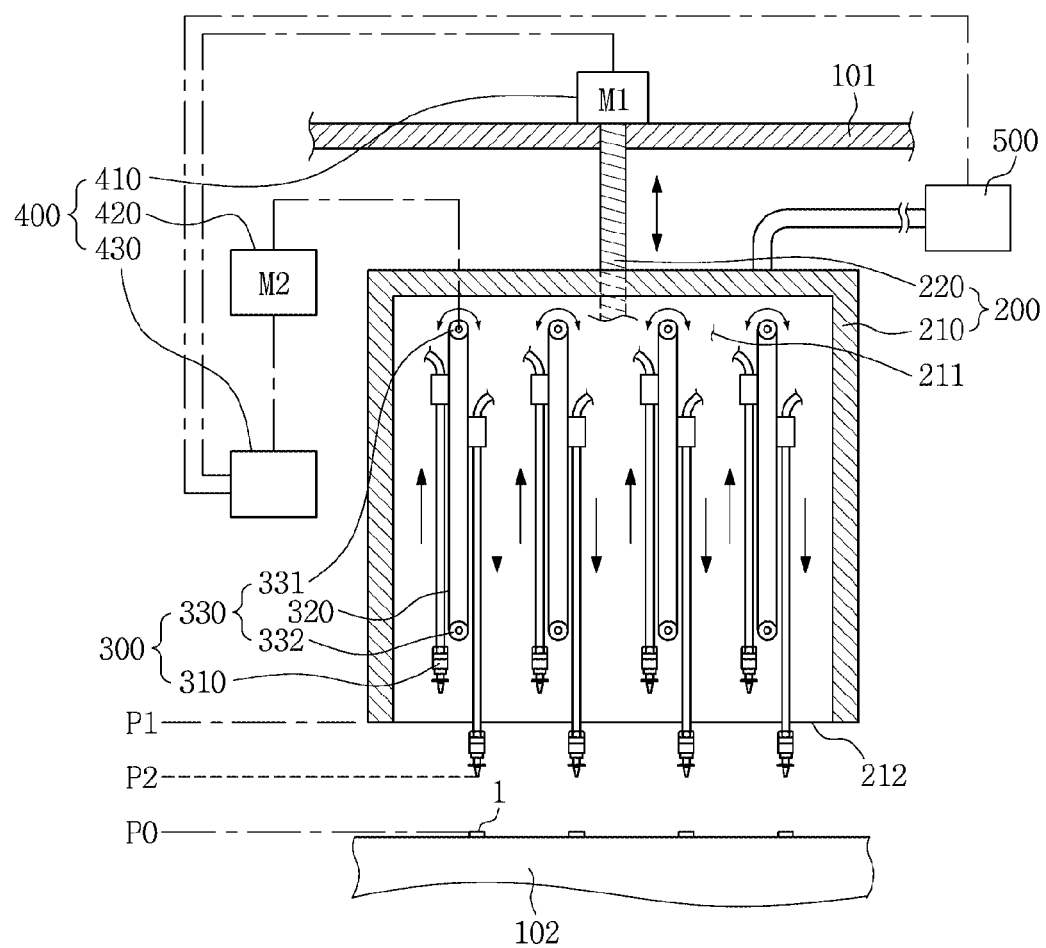
FIG. 1 illustrates a state before head and nozzle units are lowered in an apparatus for manufacturing electronic parts, according to an exemplary embodiment.

Various exemplary embodiments will now be described more fully with reference to the accompanying drawings. In the drawings, the thicknesses of layers and regions may be exaggerated for clarity. However, specific structural and functional details disclosed in the exemplary embodiments are merely representative for purposes of describing the exemplary embodiments. The present inventive concept, however, may be embodied in many alternate forms and should not be construed as limited to only the exemplary embodiments set forth herein.

Accordingly, the exemplary embodiments are capable of various modifications and alternative forms. It should be understood, however, that there is no intent to limit the exemplary embodiments to the particular forms disclosed, but on the contrary, the exemplary embodiments are to cover all modifications, equivalents, and alternatives falling within the scope of the present inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and may not be intended to be limiting other exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that spatially relative terms are intended to encompass different orientations of a device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the exemplary embodiments should not be construed as being limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe the exemplary embodiments, various aspects will be described in detail with reference to the attached drawings. However, the present inventive concept is not limited to those exemplary embodiments as described.

Exemplary embodiments relate to an apparatus for manufacturing electronic parts.

First, a configuration of an apparatus for manufacturing electronic parts according to an exemplary embodiment will be described.

Referring to FIG. 1, the apparatus for manufacturing electronic parts includes a head unit 200, a nozzle unit 300 installed on the head unit 200, and a main body 100 on which the head unit 200 is installed to move up and down.

The main body 100 may include a frame section 101 that is located above the head unit 200, and a base section 102 that is located below the head unit 200 and has electronic parts 1 standing by for suction by nozzles of the nozzle unit 300.

The head unit 200 includes a head unit body 210 that has a nozzle unit installation space 211 in which the nozzle unit 300 is installed and an opening 212 exposing the nozzle unit 300 in a downward direction, and a ball screw 220 that connects the head unit body 210 to the frame section 101 of the main body 100 and guides vertical movement of the head unit 200.

The nozzle unit 300 includes a plurality of rotary belts 320 installed upright in a vertical direction of the head unit 200, a plurality of pairs of rollers 330, each pair of the rollers supporting opposite ends of a respective rotary belt 320, and a plurality of pairs of nozzles 310, each pair of the nozzles being installed on the respective rotary belt 320. Here, each pair of rollers include a first roller 331 that supports one end of the rotary belt 320, is connected with a second motor 420 described below, and receives a rotating force from the second motor 420, and a second roller 332 that rotatably supports the other end of the rotary belt 320.

The paired nozzles 310 are disposed on each rotary belt 320 so as to be opposite to each other, and alternately move up or down along a movement path of each rotary belt 320. In other words, the paired nozzles 310 may move together on two axes.

According to an exemplary embodiment, the electronic part manufacturing apparatus includes a positioning unit 400, which sequentially moves the head unit 200 and the nozzle unit 300 to a standby position level P0 where the electronic parts 1 are on standby, and suctions the electronic parts 1 using the nozzle unit 300.

The positioning unit 400 includes a first motor 410 that is installed on the frame section 101 of the main body 100, is connected to one end of the ball screw 220 of the head unit 200, and rotates the ball screw 220 in a forward or backward direction, a second motor 420 that is connected with the first roller 331 of the paired rollers 330 of each rotary belt 320, and a controller 430 that is electrically connected with the first and second motors 410 and 420 and sequentially drives the first and second motors 410 and 420.

The controller 430 is also electrically connected with a vacuum supply 500. The vacuum supply 500 is connected to each nozzle 310, receives an electric signal from the controller 430 when the ends of the nozzles 310 reach the standby position level P0 of the electronic parts 1, and may provide a vacuum suction force to vacuum holes (not shown) formed in the end of each nozzle 310.

The controller 430 is configured to preset the standby position level P0 of the electronic parts 1, displacement levels P1 and P1' of the head unit 200, and displacement levels P2 and P2' of the nozzle unit 300. Here, the displacement level P1 is an upward movement position level of the head unit 200, and the displacement level P2 is an upward movement position level of the nozzle unit 300. The displacement level P1' is a downward movement position level of the head unit 200, and the displacement level P2' is a downward movement position level of the nozzle unit 300. The displacement levels P1 and P1' or P2 and P2' are different in a raising or lowering direction, and an interval between the displacement levels P1 and P1' is equal to that between the displacement levels P2 and P2'.

According to an exemplary embodiment, the controller 430 may drive the first and second motors 410 and 420 to sequentially adjust the downward movement position level P1' of the head unit 200 and the upward movement position level P2 of the nozzle unit 300 such that the ends of the nozzles 310 reach the standby position level P0.

According to another exemplary embodiment, it is preferable, but not necessary, that the controller 430 drives the first and second motors 410 and 420 to position the head unit 200 to the downward movement position level P1' of the head unit 200, and then position the nozzles 310 to the downward movement position level P2' of the nozzle unit 300 such that the ends of the nozzles 310 reach the standby position level P0 capable of suctioning the electronic parts 1.

As described above, when the paired nozzles 310 are disposed on each rotary belt 320 so as to be opposite to each other and move together on two axes in opposite directions, the controller 430 may control the second motor 420 to be rotated in a forward or backward direction, and adjust the nozzles 310 to the displacement level P2 of the nozzle unit 300 on alternate axes.

Figure 3:
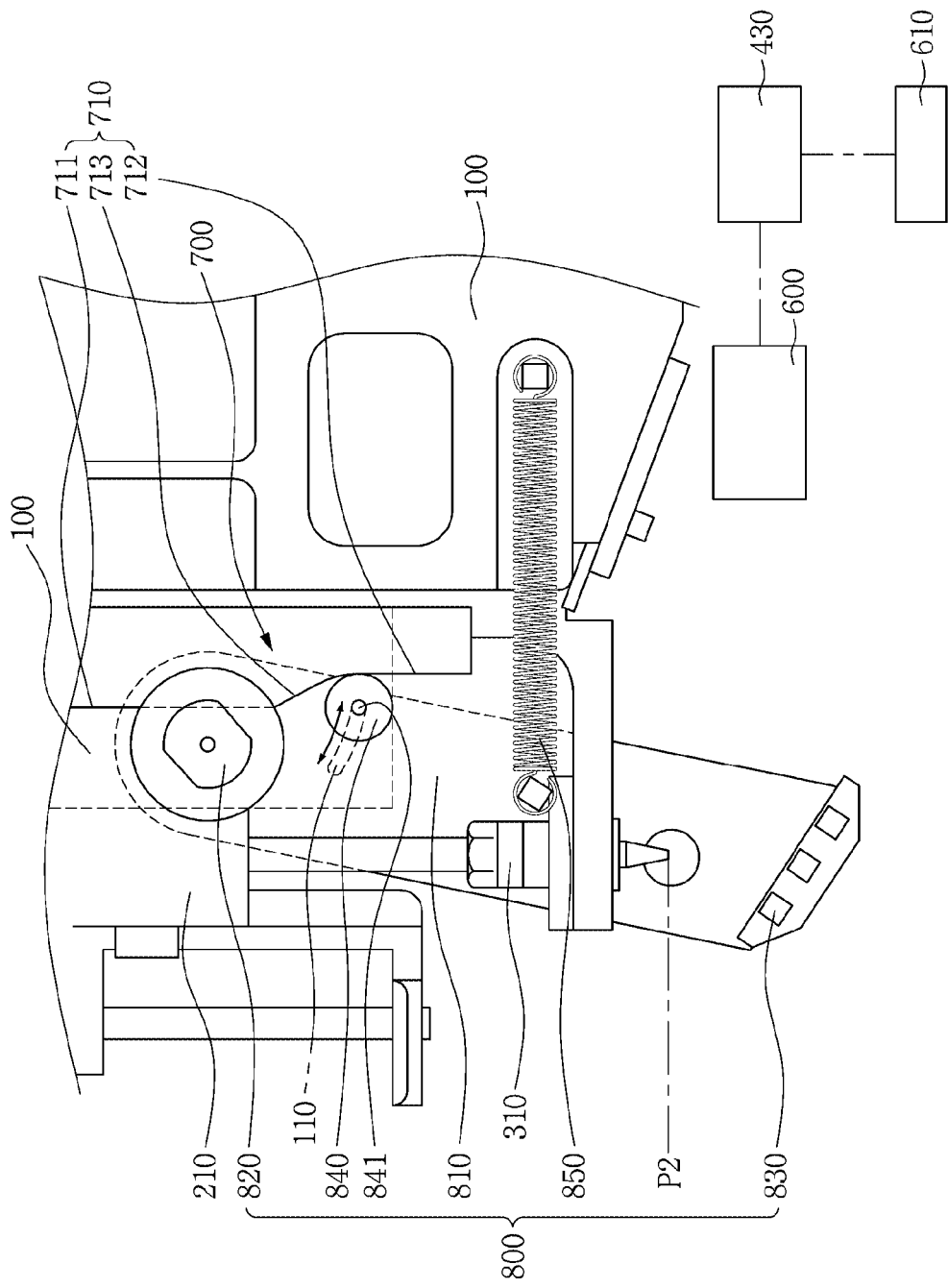
FIG. 3 illustrates a state before the head unit and a mirror unit are operated, in accordance with an exemplary embodiment, in which a cam member is installed on the head unit.
Figure 4:
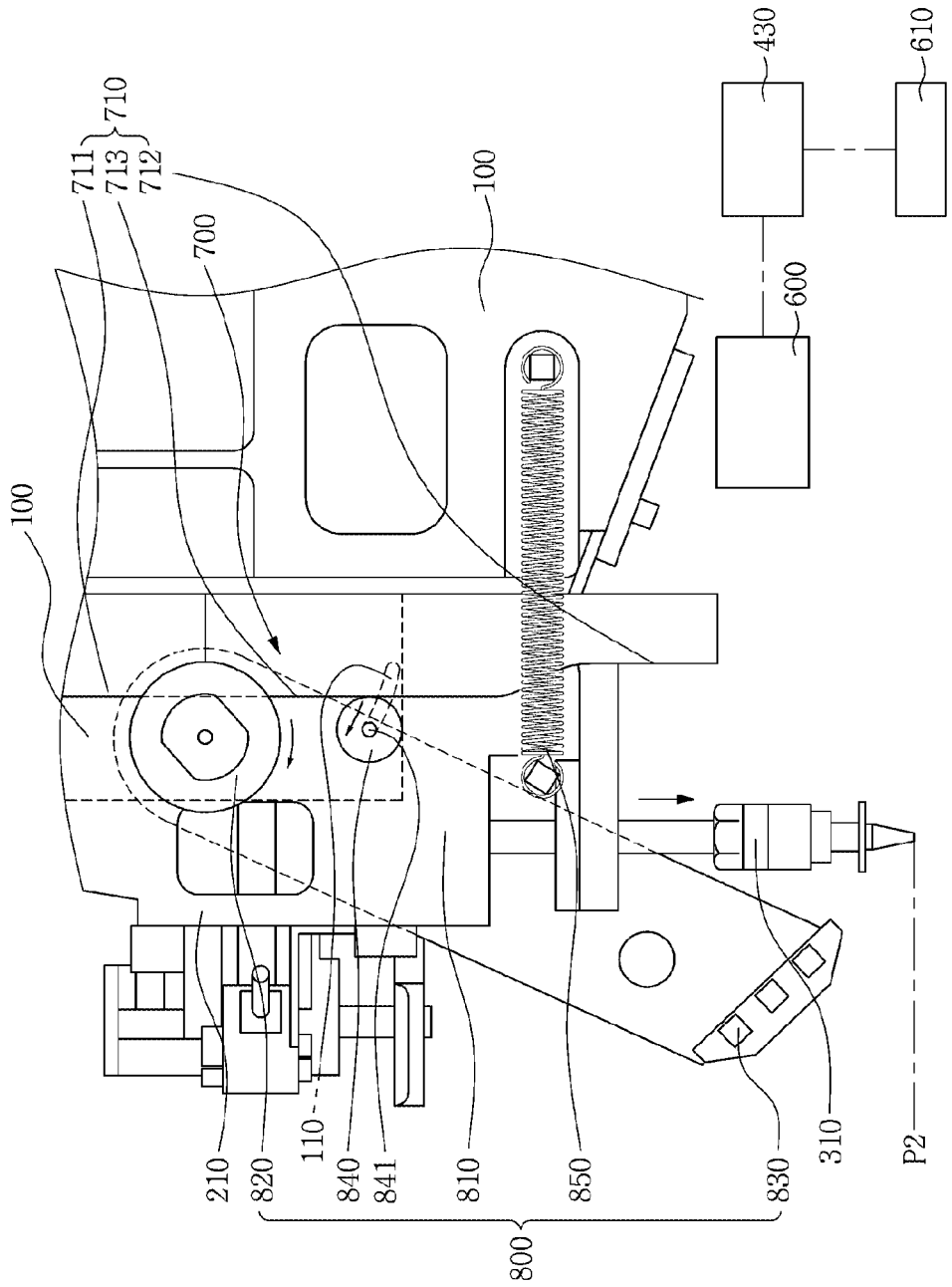
FIG. 4 illustrates a state after the head unit and the mirror unit of FIG. 3 are operated, according to an exemplary embodiment.

Referring to FIGS. 3 and 4, the electronic part manufacturing apparatus may further include a cam member 700 and a mirror unit 800, in accordance with an exemplary embodiment.

The cam member 700 is installed on a lateral portion of the head unit body 210, and has a predetermined length in a direction where the head unit body 210 moves up and down.

The mirror unit 800 is installed on the main body 100 such that one end of the mirror unit 800 is rotatably supported. The mirror unit 800 includes a mirror unit body 810 having a predetermined length, a hinge 820 installed on one end of the mirror unit body 810, and at least one mirror 830 installed on the other end of the mirror unit body 810. The hinge 820 is hinged to the main body 100. The mirror 830 is located below or deviates from a lower portion of the nozzle unit 300 while the mirror unit body 810 rotates in cooperation with the upward or downward movement of the head unit body 210.

The mirror unit body 810 is provided with a driven member 840, e.g., a driven roller, that is in close contact with one face of the cam member 700. When the mirror unit body 810 moves downward, the driven member 840 is pushed to one side thereof in close contact with one face of the cam member 700. Thereby, the mirror unit body 810 is rotated in a left-hand upward direction such that the mirror 830 deviates from a position located below the lower portion of the nozzle unit 300.

The one face of the cam member 700, where the driven member contacts, is formed such that a width of the cam member 700 is gradually reduced in a direction where the head unit 200 moves downward. The main body 100 has a movement path 110 following a rotation path of the mirror unit body 810. A central shaft 841 of the driven member 840 is movably disposed along the movement path 110. The mirror unit body 810 is connected with an elastic member 850 at a predetermined position, and thus, is able to be returned to its original position using the elastic member 850.

The one face of the cam member 700, where the driven member contacts, includes a first face 711 at which the cam member 700 has a first width, a second face 712 at which the cam member 700 has a second width which is smaller than the first width, and a third face 713. The driven member 840 contacts the first face 711 when the driven member 840 is pushed to one side of the cam member 700, and contacts the second face 712 when the driven member 840 returns to its original position from the position of the one side of the cam member 700. The third face 713 is an inclined face which interconnects the first face 711 and the second face 712, and through which the driven member 840 is smoothly pushed to the one side of the cam member 700 and is smoothly returned to the original position.

Figure 5:
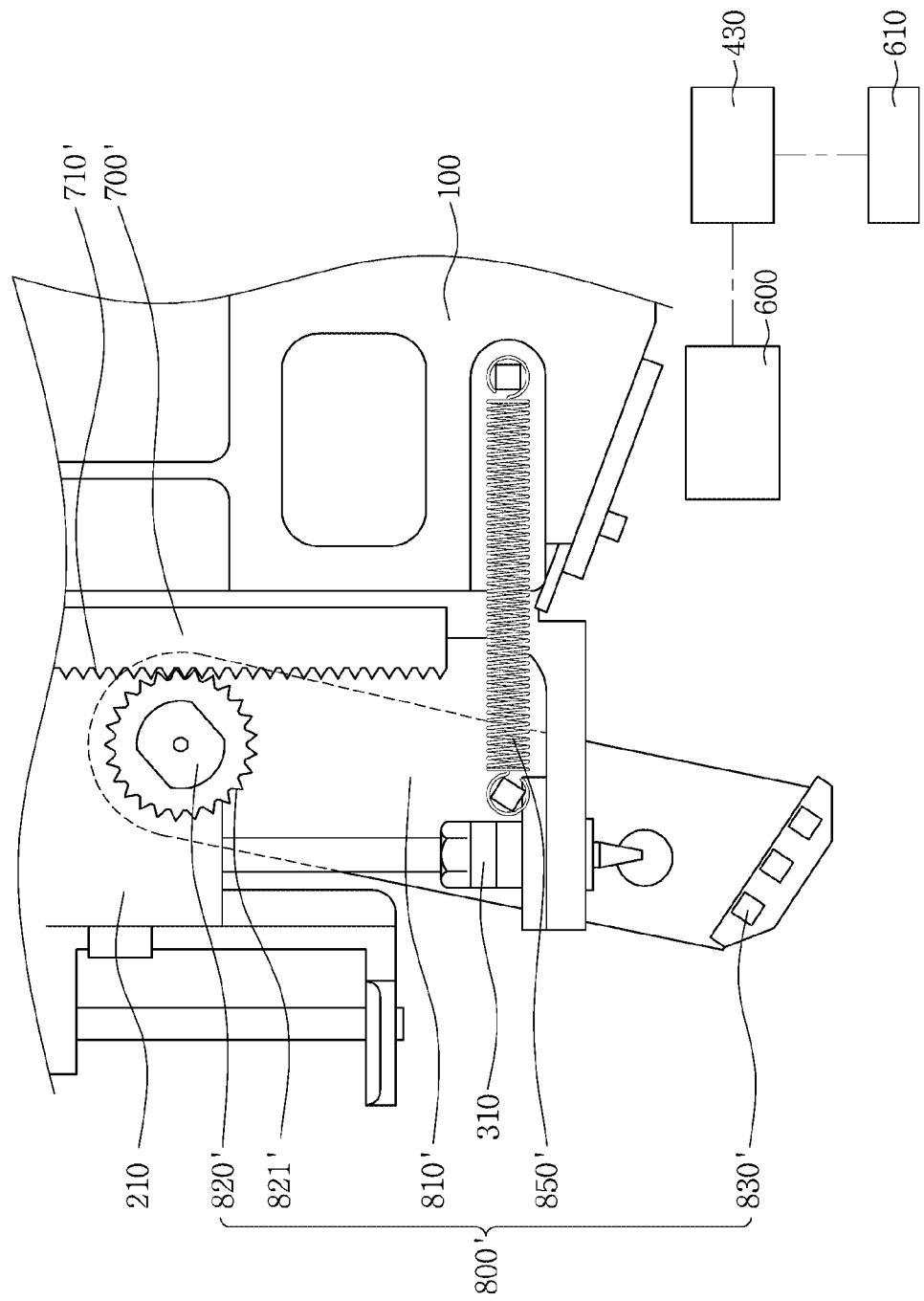
FIG. 5 illustrates a state before the head unit and the mirror unit are operated, in accordance with another exemplary embodiment, in which a cam member is installed on the head unit.
Figure 6:
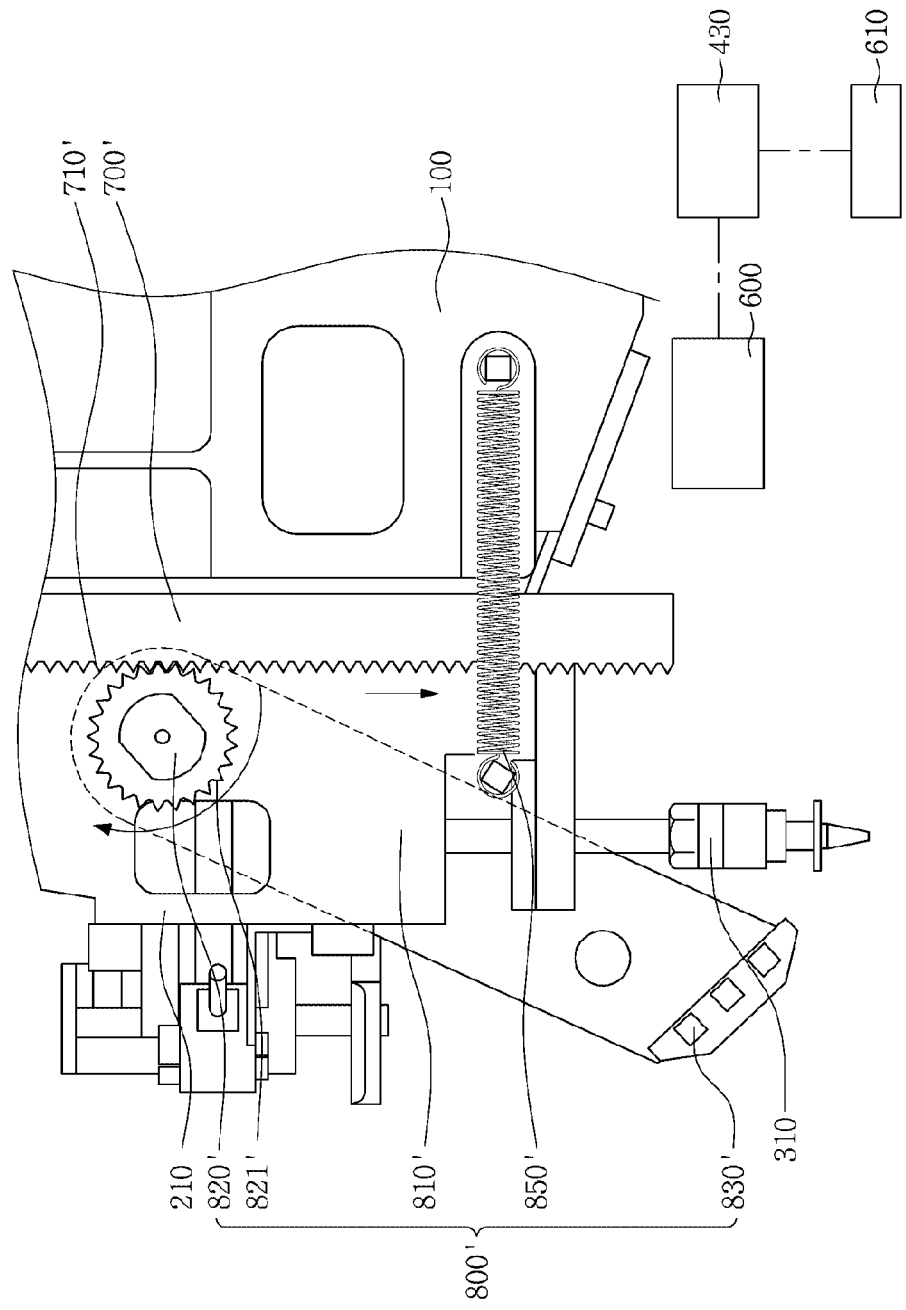
FIG. 6 illustrates a state after the head unit and the mirror unit of FIG. 5 are operated.

According to another exemplary embodiment as illustrated in FIGS. 5 and 6, the head unit body 210 is provided with a cam member 700' on one side thereof. The cam member 700' has a predetermined length in a direction where the head unit body 210 moves up and down, and includes gear teeth 710' formed on one face thereof.

The main body 100 is provided with a hinge 820' at one end thereof and a mirror unit body 810' having at least one mirror 830' at the other end thereof. Here, the hinge 820' is engaged with the gear teeth 710' formed on one face of the cam member 700'. To this end, the hinge 820' is provided with gear teeth 821' on an outer circumference thereof.

When the head unit body 210 moves downward, the hinge 820' is rotated in engagement with one face of the cam member 700' moving downward, and the mirror unit body 810' is rotated upward (i.e., in a clockwise direction). Thus, the mirror 830' may deviate from the position located below the lower portion of the nozzle unit 300.

The main body 100 is provided with an image acquisition unit 600, which acquires an image, reflected from the electronic part 1 suctioned to the lower end of each nozzle 310, through the mirror 830, and sends it to the controller 430. The controller 430 compares the sent image of the electronic part 1 with a preset image of the electronic part 1, and determines whether an area of the electronic part 1 suctioned to the lower end of the nozzle 310 matches with the preset image of the electronic part 1. Here, if the suctioned area and the preset image are different from each other, the controller 430 stops driving the first and second motors 410 and 420. The controller 430 may also be electrically connected with an alarm generator 610 generating an alarm in response to the stop of the first and second motors 410 and 420.

Figure 7:
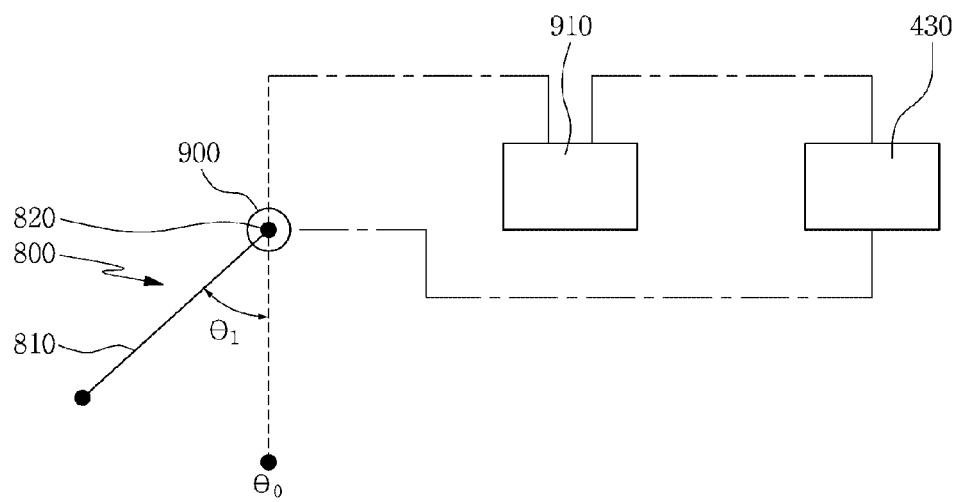
FIG. 7 is a diagram illustrating positions of open and closed rotational angles of the mirror unit, in accordance with an exemplary embodiment.
Figure 8:
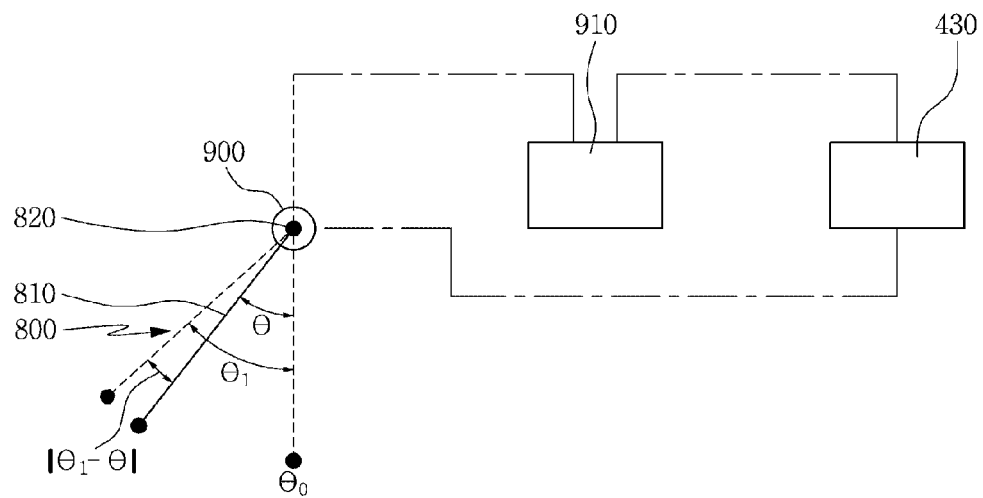
FIG. 8 illustrates a process of correcting the open rotational angle position of the mirror unit of FIG. 7, in accordance with an exemplary embodiment.

Referring to FIGS. 7 and 8, the hinge 820 of the mirror unit body 810 may be provided with a rotational angle detection sensor 900 detecting a rotational angle of the mirror unit body 810, in accordance with an exemplary embodiment.

The hinge 820 of the mirror unit body 810 may also include a third motor 910, operation of which is controlled by the controller 430.

The controller 430 may be configured to preset an open rotational angle $\theta_1$ when the mirror 830 deviates from the position located below the lower portion of the nozzle unit 300, and a closed rotational angle $\theta_0$ when the mirror 830 is located at the position below the lower portion of the nozzle unit 300.

Thus, the controller 430 may control the operation of the third motor 910 such that a rotational angle θ detected when the mirror 830 deviates from the position located below the lower portion of the nozzle unit 300 is equal to the open rotational angle $\theta_1$, and another rotational angle θ detected when the mirror 830 is located at the position below the lower portion of the nozzle unit 300 is equal to the closed rotational angle $\theta_0$.

Next, an exemplary operation of the electronic part manufacturing apparatus having the aforementioned configuration will be described.

According to an exemplary embodiment referring to FIG. 1, the positioning unit 400 functions to guide the ends of the nozzles 310 to a position where the nozzles 310 are able to suction the corresponding electronic part 1 by lowering the head unit 200 and the nozzle unit 300, both of which are on standby at their original positions, to the respective downward movement position level P1' and P2'. In detail, the positioning unit 400 may guide the electronic parts 1 to the standby position level P0 where the nozzles 310 can suction the electronic parts 1 by lowering the head unit 200 and the nozzle unit 300 in a multilevel and sequential fashion, and relieve an impact occurring when the nozzles 310 suction the electronic parts 1.

Figure 2:
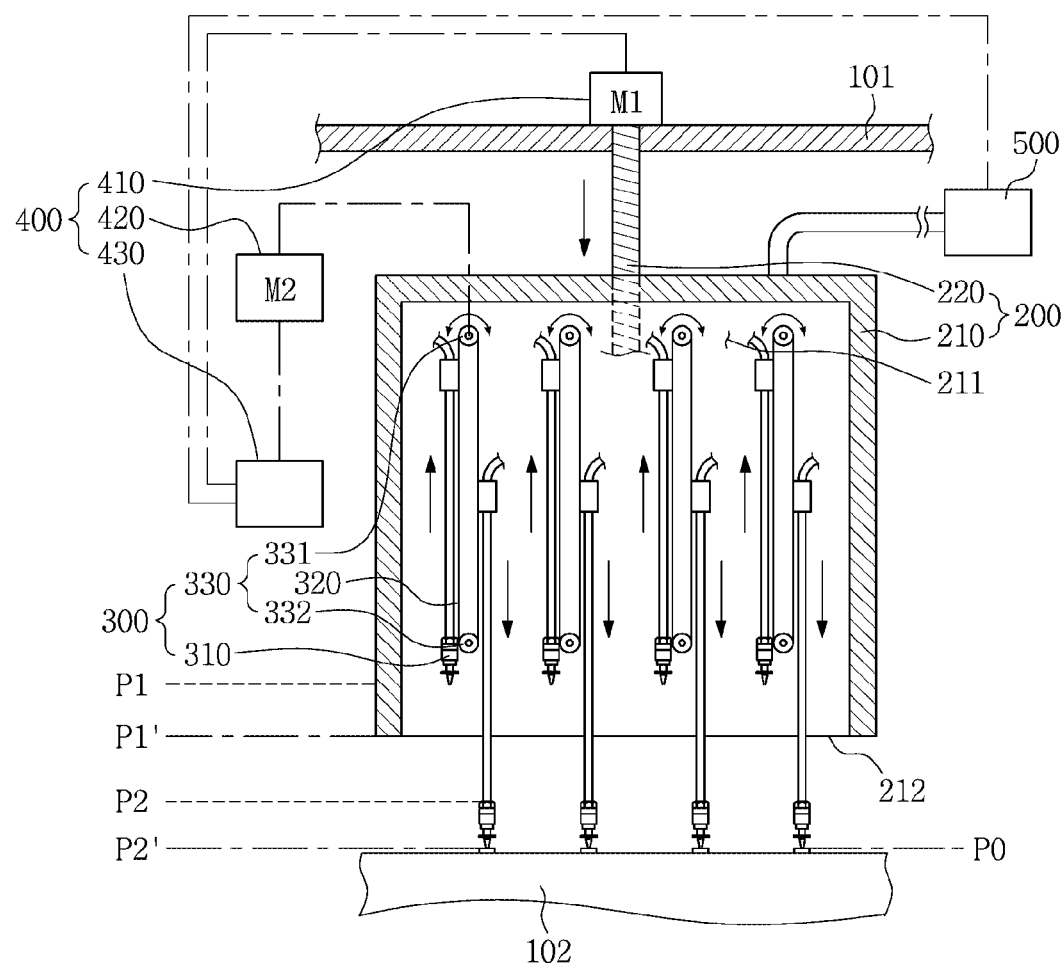
FIG. 2 illustrates a state after the head and nozzle units are lowered in the apparatus for manufacturing electronic parts, according to an exemplary embodiment.
Figure 10:
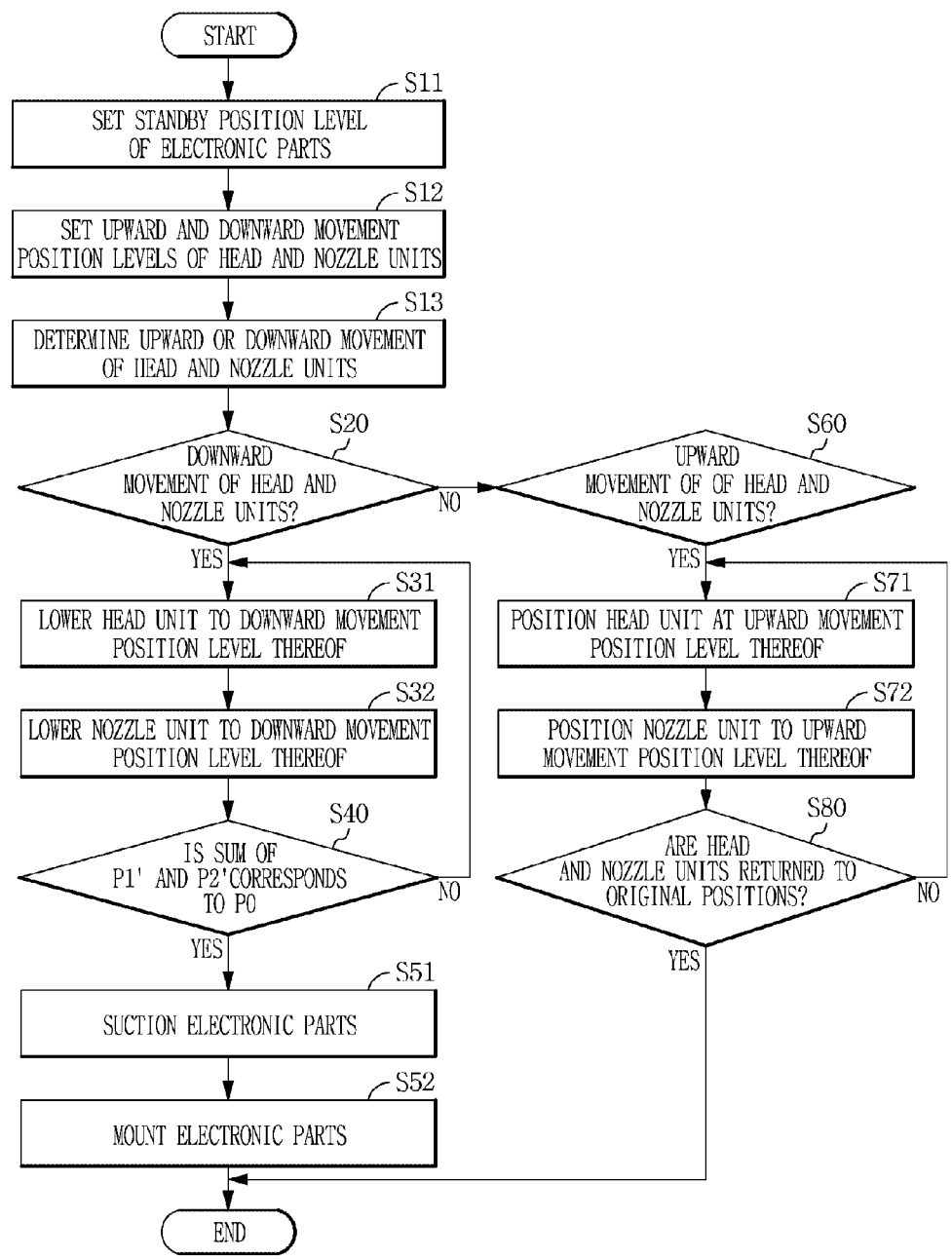
FIG. 10 is a flow chart illustrating a process of suctioning electronic parts in an apparatus for manufacturing electronic parts according to an exemplary embodiment.

According to an exemplary embodiment referring to FIGS. 1, 2 and 10, the standby position level P0 of the electronic parts 1, the upward movement position levels P1 and P2, and the downward movement position levels P1' and P2' of the head unit 200 and the nozzle unit 300 are set at the controller 430 (S11 and S12). Here, the upward movement position levels P1 and P2 of the head unit 200 and the nozzle unit 300 are levels where the head unit 200 and the nozzle unit 300 can be on standby at their original positions, whereas the downward movement position levels P1' and P2' of the head unit 200 and the nozzle unit 300 are levels where the head unit 200 and the nozzle unit 300 can be sequentially lowered to suction the electronic parts 1 to the ends of the nozzles 310.

Subsequently, the controller 430 may determine an upward or downward movement of the head unit 200 and the nozzle unit 300 (S13). In other words, the controller 430 may determine whether to move the head unit 200 and the nozzle unit 300 in an upward direction or a downward direction. Here, when the electronic parts 1 are on standby on the top of the base section 102 of the main body 100, the controller 430 may determine the downward movement of the head unit 200 and the nozzle unit 300, i.e., to move the head unit 200 and the nozzle unit 300 in the downward direction. Although not shown, when the controller 430 is electrically connected with an electronic part feeder capable of feeding the electronic parts 1 to the base section 102, and thus, the electronic parts 1 are fed to the base section 102, the controller 430 receives an electric signal from the electronic part feeder to determine the downward movement of the head unit 200 and the nozzle unit 300.

When the downward movement of the head unit 200 and the nozzle unit 300 is determined (S20), the controller 430 sequentially lowers the head unit 200 and the nozzle unit 300 to the respective downward movement position levels P1' and P2' (S31 and S32).

In detail, the head unit 200 is lowered by the controller 430, which drives the first motor 410 to rotate the ball screw 220 connected to the upper end of the head unit 200 in a forward direction. Here, when the ball screw 220 is rotated in a backward direction, the head unit 200 is raised. Among the nozzles 310, ones installed on one of the parallel opposite sides of the rotary belts 320 are lowered by the controller 430 as the controller 430 drives the second motors 420 to rotate the first rollers 331 supporting one ends of the rotary belts 320, and thus, rotates the rotary belts 320. Here, the second motors 420 may be alternately driven in a forward or backward direction by a control signal of the controller 430. Accordingly, the nozzles 310 installed on the respective rotary belts 320 so as to be opposite to each other may be alternately raised or lowered. That is, the nozzles 310 installed on the respective rotary belts 320 may move together on two axes in opposite directions.

As described above, when the head unit 200 is located at its downward movement position level P1', and then the nozzle unit 300 is located at its downward movement position level P2', the controller 430 may determine if a sum of the downward movement position level P1' of the head unit 200 and the downward movement position level P2' of the nozzle unit 300 corresponds to the standby position level P0 of the electronic parts (S40).

Here, if the sum of the downward movement position level P1' of the head unit 200 and the downward movement position level P2' of the nozzle unit 300 corresponds to the standby position level P0 of the electronic parts, the controller 430 operates the vacuum supply 500 to supply a vacuum suction force to the nozzles 310 located at the downward movement position level P2' of the nozzle unit, and thus, the electronic parts 1 contacting the ends of the nozzles 310 may be suctioned to the ends of the nozzles 310 (S51).

Then, the controller 430 may control a transfer unit (not shown) to transfer and mount the electronic parts 1 suctioned to the nozzles 310 to and on a printed circuit board (not shown) (S52).

On the other hand, in operation S20, when the downward movement of the head unit 200 and the nozzle unit 300 is not determined, the controller 430 determines the upward movement (S60). That is, the controller 430 determines to move the head unit 200 and the nozzle unit 300 in the upward direction. In this case, the controller 430 may position the head unit 200 and the nozzle unit 300 at the respective upward movement position levels P1 and P2 (S71 and S72).

The controller 430 may control the driving of the first and second motors 410 and 420 such that the head unit 200 and the nozzle unit 300 continue to move upward until they reach their original positions.

According to an exemplary embodiment as illustrated in FIGS. 3 and 4, in order to be able to suction the electronic parts 1, it is mechanically possible to position the mirror 830 provided below the nozzle unit 300 to one side when the head unit 200 and the nozzle unit 300 are sequentially lowered, and to again position the mirror 830 below the nozzle unit 300 when the head unit 200 and the nozzle unit 300 are raised.

First, referring to FIG. 3, the state before the mirror unit 800 is located at its original position, i.e., below the nozzle unit 300, is shown. Here, the central shaft 841 of the driven member 840, e.g., a driven roller, installed on the mirror unit body 810, is located at a right end of the movement path 110 formed in the main body 100. The outer circumference of the driven member 840 comes into contact with the second face 712 of the cam 700 at which the cam has a smaller width than the first face 711. Here, the movement path 110 is formed at a predetermined length in a direction where the central shaft 841 of the driven member 840 rotates around the hinge 820 of the mirror unit body 810. The mirror unit body 810 is connected with a preset portion of the main body 100 by the elastic member 850.

In this state, referring to FIG. 4, when the head unit 200 is lowered, the cam member 700 installed on the lateral portion of the head unit body 210 is also rotated. At this time, the outer circumference of the driven member 840 sequentially contacts the second face 712, the inclined face 713, and the first face 711 of the cam member 700. Here, since the width of the cam 700 is greater at the first face 711 than at the second face 712, the driven member 840 may be pushed to the left side. Thus, the central shaft 841 of the driven member 840 is located at the left end of the movement path 110, and the mirror unit body 810 is rotated in a left-hand upward direction at a predetermined angle, and is located here. Here, the rotational angle may be an open rotational angle $\theta_1$ which will be described below.

Thus, the mirror 830 may be rotated to and located on one side so as not to collide with the ends of the head unit 200 and nozzle unit 300 moving downward. This state is referred to as "after the operation of the mirror unit 800."

The elastic member 850, which elastically supports parts of the mirror unit body 810 and the main body 100, is expanded by a predetermined length. Thus, the elastic member 850 has a predetermined elastic restoring force, which restores the mirror unit body 810 to its original position.

Here, the driven member 840 is displaced in contact with the one face of the cam member 700 moving up and down. At this time, since the inclined face 713 of the cam member 700 connects the first and second faces 711 and 712 and is inclined so as to have a predetermined curvature, the vibration generated by the movement of the driven member 840 is relieved by the inclined face 713, so that the mirror unit body 810 can be induced to rotate stably.

On the other hand, FIGS. 5 and 6 show the cam member 700' having the gear teeth 710' on one face thereof and the hinge 820' of the mirror unit body 810' which is engaged with the gear teeth 710' of the cam member 700'.

When the head unit body 210 is lowered, the hinge 820' of the mirror unit body 810' which is engaged with one face of the cam member 700' is rotated in a left-hand upward direction, as illustrated in FIG. 6. Thus, the mirror unit body 810' is rotated in the left-hand upward direction, so that the mirror 830' can deviate from a position located below the lower portion of the nozzle unit 300. Here, the rotational angle may be an open rotational angle $\theta_1$ which will be described below.

In detail, as illustrated in FIGS. 5 and 6, the hinge 820' of the mirror unit body 810' cooperates with the cam member 700' moving up and down. The elastic member 850, which elastically supports parts of the mirror unit body 810 and the main body 100, has the same function as described above referring to FIGS. 3 and 4, and so a description thereof will be omitted.

According to an exemplary embodiment, the hinge 820 of the mirror unit body 810 may include the rotational angle detection sensor 900, and is connected with the third motor 910. Here, the rotational angle detection sensor 900 detects a rotational angle of the mirror unit body 810, and sends the detected rotational angle to the controller 430. The driving of the third motor 910 is controlled by the controller 430.

This configuration will be described in greater detail with reference to FIGS. 7, 8 and 11.

In FIG. 7, the rotational angle before the operation of the mirror unit body 810 and the rotational angle after the operation of the mirror unit body 810 are shown. Here, the rotational angle before the operation of the mirror unit body 810 is referred to as a closed rotational angle $\theta_0$, and the rotational angle after the operation of the mirror unit body 810 is referred to as a closed rotational angle $\theta_1$.

FIG. 8 illustrates that the head unit 200 is lowered, and thus the mirror unit body 810 is rotated in a left-hand upward direction.

Referring to FIG. 8, when the mirror unit body 810 is rotated in the left-hand upward direction by the downward movement of the cam member 700 or 700', the rotational angle detection sensor 900 detects a rotational angle of the mirror unit body 810, and sends the detected rotational angle to the controller 430. Here, an open rotational angle $\theta_1$ and a closed rotational angle $\theta_0$ are preset for the controller 430.

When the detected rotational angle is $\theta$, the controller 430 drives the third motor 910 such that the detected rotational angle $\theta$ reaches the open rotational angle $\theta_1$. In other words, the controller 430 drives the third motor 910 such that the mirror unit body 810 can be additionally rotated at the detected rotational angle $\theta$ by an absolute value $|\theta_1-\theta|$.

Figure 9:
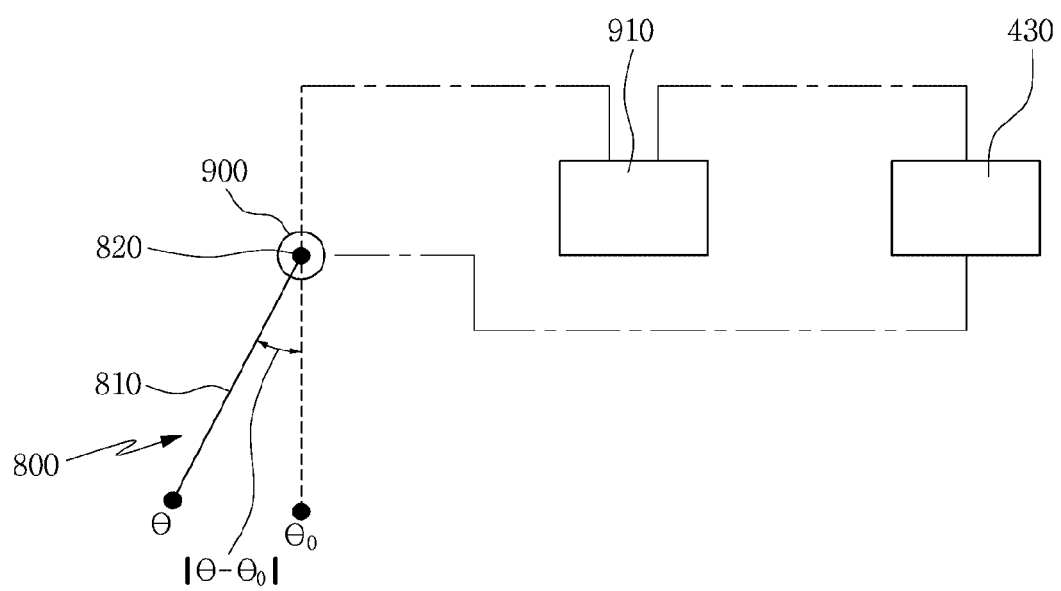
FIG. 9 illustrates a process of correcting the closed rotational angle position of the mirror unit of FIG. 7, in accordance with an exemplary embodiment.

By contrast, referring to FIG. 9, when the mirror unit body 810 is rotated to its original position by the upward movement of the cam member 700 or 700', the rotational angle detection sensor 900 detects a rotational angle of the mirror unit body 810, and sends the detected rotational angle to the controller 430. Here, the open rotational angle $\theta_1$ and the closed rotational angle $\theta_0$ are preset for the controller 430.

When the detected rotational angle is $\theta$, the controller 430 drives the third motor 910 such that the detected rotational angle $\theta$ reaches the closed rotational angle $\theta_0$. In other words, the controller 430 drives the third motor 910 such that the mirror unit body 810 can be additionally rotated at the detected rotational angle $\theta$ by an absolute value $|\theta-\theta_0|$.

In the exemplary embodiment illustrated in FIGS. 7 through 9, the rotational angle detection sensor 900, the third motor 910, and the controller 430 may correct the rotational angle of the mirror unit body 810 in real time so as to reach the preset open or closed rotational angle $\theta_1$ or $\theta_0$ of the mirror unit body 810. Accordingly, the mirror 830 is induced to safely deviate from the lower portion of the nozzle 300 or return to its normal original position again, so that a rotational position error generated by the mechanical rotation of the mirror unit body 810 can be easily corrected.

This process of correcting the rotational angle of the mirror unit 800 according to an exemplary embodiment will be described in greater detail with reference to FIG. 11.

Figure 11:
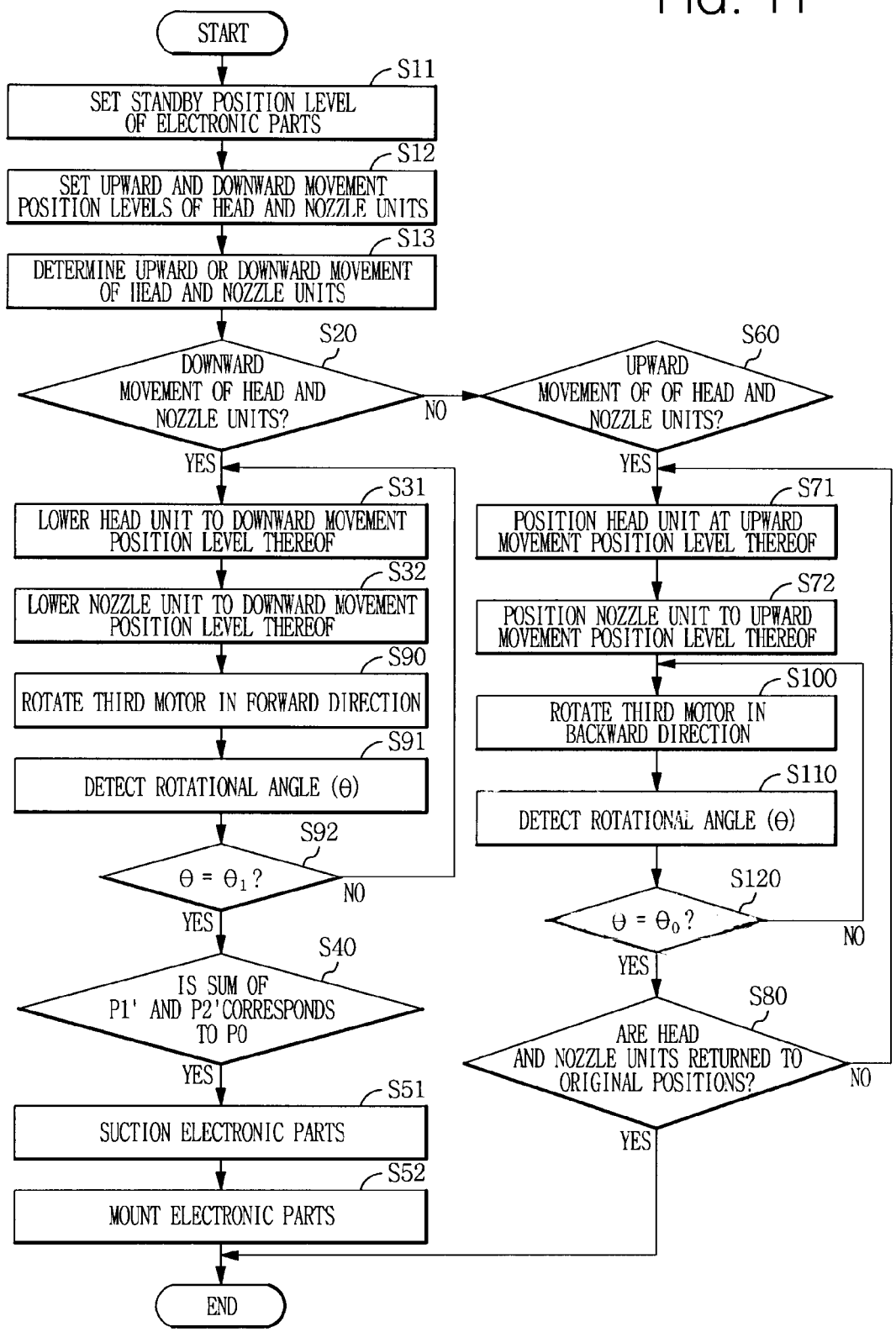
FIG. 11 is a flow chart illustrating a process of correcting a rotational angle position of a mirror unit, which is added to the process of FIG. 10 of suctioning electronic parts in an apparatus for manufacturing electronic parts, according to an exemplary embodiment.

Operations S11 through S32 of FIG. 11 are the same as in FIG. 10, and so a description thereof will be omitted.

When the head unit 200 is lowered, the third motor 910 receives an electric signal from the controller 430, and thus is rotated in a forward direction (S90). At this time, the mirror unit body 810 is rotated to reach the open rotational angle $\theta_1$. The rotational angle detection sensor 900 detects a rotational angle $\theta$ of the mirror unit body 810, and sends the detected rotational angle $\theta$ to the controller 430 (S91).

The controller 430 may determine whether the detected rotational angle $\theta$ is equal to the open rotational angle $\theta_1$ (S92), and control the driving of the third motor 910 such that detected rotational angle $\theta$ is equal to the open rotational angle $\theta_1$.

In contrast, when the head unit 200 is raised, the third motor 910 receives an electric signal from the controller 430, and thus is rotated in a backward direction (S100). At this time, the mirror unit body 810 is rotated to reach the closed rotational angle $\theta_0$. The rotational angle detection sensor 900 detects a rotational angle $\theta$ of the mirror unit body 810, and sends the detected rotational angle $\theta$ to the controller 430 (S110).

The controller 430 may determine whether the detected rotational angle $\theta$ is equal to the closed rotational angle $\theta_0$ (S120), and control the driving of the third motor 910 such that the detected rotational angle $\theta$ is equal to the closed rotational angle $\theta_0$.

In the exemplary embodiment described with reference to FIGS. 7, 8, 9 and 11, the mirror unit 800 illustrated in FIGS. 3 and 4 has been described by way of a typical example, but this description may be equally applied to the mirror unit 800' illustrated in FIGS. 5 and 6.

According to the above-described exemplary embodiments, when the head unit 200 is used to suction the electronic parts 1 on standby at the standby position of the electronic parts 1, the head unit 200 and the nozzle unit 300 installed on the head unit 200 are sequentially lowered, so that it is possible to relieve an impact occurring when the electronic parts are suctioned to the ends of the nozzles.

Further, the upward or downward movement of the head unit 200 and the nozzle unit 300 installed on the head unit 200 can cooperate with the movement of the mirror 830 located below the nozzles 310 to the standby or operating position.

In addition, it may be monitored whether the movement of the mirror to the standby or operating position is normally completed, and thus it may be possible to correct the positions in real time such that the positions are normal.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages. Accordingly, all such modifications are intended to be included within the scope of this inventive concept as defined in the claims. In the claims, means-plus-function clauses, if any, are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An apparatus for placing electronic parts, comprising:
    a main body;
    a head unit which is installed on the main body and configured to move up and down, and comprising a head unit body comprising a nozzle unit installation space;
    a nozzle unit which is installed on the head unit and comprises at least one nozzle configured to move up and down; and
    a positioning unit which sequentially displaces the head unit and the at least one nozzle to first and second positions, respectively,
    wherein the electronic parts are on standby at the second position to be picked up by the at least one nozzle, and
    wherein the head unit comprises:
    a head unit body comprising:
        a nozzle unit installation space in which the nozzle unit is installed and an opening exposing the nozzle unit in a downward direction; and
        a connecting member connecting the head unit body to the main body, and wherein the nozzle unit comprises:
        a plurality of nozzles disposed in the nozzle unit installation space at predetermined intervals;
        a plurality of rotary belts connected with the plurality of nozzles and installed upright such that the plurality of nozzles move up and down; and
        a plurality of pairs of rollers, each pair supporting opposite ends of a respective rotary belt of the plurality of rotary belts.

2. The apparatus according to claim 1, wherein the plurality of nozzles are configured to move up and down, and
    wherein the positioning unit moves the head unit and the nozzle unit sequentially such that the head unit moves down to the first position, and then, the plurality of nozzles move down to the second position where the electronic parts on standby are picked up by the plurality of nozzles, respectively.

3. The apparatus of claim 2, wherein the plurality of nozzles move down to the second position at the same time.

4. The apparatus according to claim 1, wherein each of the plurality of rotary belts is connected with a pair of nozzles among the plurality of nozzles moving together on two axes, and the pair of nozzles are installed on the each rotary belt to be opposite to each other.

5. The apparatus according to claim 4, wherein the pair of nozzles connected with the each of the plurality of rotary belts move together on two axes such that the pair of nozzles move in two different directions at the same time.

6. The apparatus according to claim 5, wherein the positioning unit comprises:
    a first motor which is installed on the main body and is connected to one end of the connecting member;
    a second motor which is connected with one of the each pair of the plurality of rollers; and
    a controller which is electrically connected with the first and second motors and sequentially drives the first and second motors,
    wherein the controller is configured to preset a standby position level of the electronic parts, displacement levels of the head unit, and displacement levels of the nozzle unit, the displacement levels of the head unit being upward and downward movement position levels of the head unit, and the displacement levels of the nozzle unit being upward and downward movement position levels of the nozzle unit, and
    wherein the controller drives the first and second motors to lower the head unit and the nozzle unit to the downward movement position levels of the head unit and the nozzle unit, respectively, such that ends of the pair of nozzles reach the standby position level.

7. The apparatus according to claim 6, wherein the controller drives the first and second motors to adjust the head unit to the downward movement position level of the head unit, and then, adjust the nozzle unit to the downward movement position level of the nozzle unit such that the ends of the pair of nozzles reach the standby position level.

8. The apparatus according to claim 6, wherein, when the pair of nozzles move together on the two axes, the controller controls the second motor to rotate in a forward or backward direction such that the pair of nozzles reach the downward movement position level of the nozzle unit on alternate axes.

9. The apparatus according to claim 6, wherein the positioning unit is connected with a vacuum supply supplying a vacuum suction force to pick up the electronic parts using the plurality of nozzles of the nozzle unit, and wherein the controller operates the vacuum supply when the ends of the pair of nozzles reach the standby position level.

10. The apparatus according to claim 6, wherein the head unit body further comprises a cam member on a lateral portion thereof which has a predetermined length in a direction where the head unit body moves up and down,
wherein the main body comprises a mirror unit which is hinged to the main body at one end thereof and comprises at least one mirror at the other end thereof, the mirror being located at or deviating from a position located below a lower portion of the nozzle unit as the head unit body moves upward or downward,
wherein the mirror unit comprises a driven member which is in close contact with one face of the cam member, and
wherein when the head unit body is lowered to move downward, the driven member is pushed to one side in close contact with the one face of the cam member such that the mirror unit deviates from the position located below the lower portion of the nozzle unit.

11. The apparatus according to claim 10, wherein the main body includes an image acquisition unit that acquires an image reflected from an electronic part of the electronic parts picked up by an end of one of the pair of nozzles through the mirror and sends the acquired images to the controller, and
wherein the controller compares the sent image of the electronic part with a preset image of the electronic part, determines whether an area of the electronic part which is picked up by the end of one of the pair of nozzles matches with the preset image, stops driving the first and second motors if the area of the electronic part which is picked up by the end of one of the pair of nozzles and the preset image are different from each other.

12. The apparatus according to claim 10 further comprising a rotational angle detection sensor, which detects a rotational angle of the mirror unit, and a third motor controlled by the controller,
wherein the controller is configured to preset an open rotational angle when the mirror deviates from the position located below the lower portion of the nozzle unit and a closed rotational angle when the mirror is located at the position located below the lower portion of the nozzle unit, and
wherein the controller controls operation of the third motor such that a rotational angle detected when the mirror deviates from the position located below the lower portion of the nozzle unit is equal to the open rotational angle, and such that another rotational angle detected when the mirror is located at the position located below the lower portion of the nozzle unit is equal to the closed rotational angle.

13. The apparatus according to claim 10, wherein the driven member is a roller rotatably installed on the mirror unit,
wherein the one face of the cam member is formed such that a width thereof is reduced in a direction where the head unit is lowered,
wherein the main body comprises a movement path of a central shaft of the roller formed along a rotational path of the mirror, and
wherein the mirror unit is connected with a predetermined part of the main body and is returned to an original position thereof which is the position located below the lower portion of the nozzle unit.

14. The apparatus according to claim 13, wherein the one face of the cam member comprises a first face at which the cam member has a first width, a second face at which the cam member has a second width smaller than the first width, and an inclined face interconnecting the first face and the second face, and
wherein the roller contacts the first face when the roller is pushed to one side of the cam member and contacts the second face when the roller returns to an initial position.

15. The apparatus according to claim 6, wherein the head unit body further comprises a cam member on a lateral portion thereof, the cam member having a predetermined length in a direction where the head unit body moves up and down and comprising gear teeth formed on one face thereof,
wherein the main body comprises a mirror unit which is hinged to the main body at one end thereof and comprises at least one mirror at the other end thereof, the mirror being located at or deviating from a position located below a lower portion of the nozzle unit as the head unit body moves upward or downward, and
wherein the mirror unit is engaged with the one face of the cam member at one end thereof, and is rotated to deviate from the position located below the lower portion of the nozzle unit in engagement with the one face of the cam member moving downward when the head unit body is lowered to move downward.

16. The apparatus according to claim 15, wherein the main body includes an image acquisition unit that acquires an image reflected from an electronic part among the electronic parts picked up by an end of one of the pair of nozzles through the mirror and sends the acquired images to the controller, and
wherein the controller compares the sent image of the electronic part with a preset image of the electronic part, determines whether an area of the electronic part which is picked up by the end of one of the pair of nozzles matches with the preset image, stops driving the first and second motors if the area of the electronic part which is picked up by the end of one of the pair of nozzles and the preset image are different from each other.

17. The apparatus according to claim 15, further comprising a rotational angle detection sensor, which detects a rotational angle of the mirror unit, and a third motor controlled by the controller,
wherein the controller is configured to preset an open rotational angle when the mirror deviates from the position located below the lower portion of the nozzle unit and a closed rotational angle when the mirror is located at the position located below the lower portion of the nozzle unit, and
wherein the controller controls operation of the third motor such that a rotational angle detected when the mirror deviates from the position located below the lower portion of the nozzle unit is equal to the open rotational angle, and such that another rotational angle detected when the mirror is located at the position located below the lower portion of the nozzle unit is equal to the closed rotational angle.

18. The apparatus according to claim 6, wherein the controller drives the first and second motors to adjust the head unit to the downward movement position level of the head unit, and then, adjust the nozzle unit to the upward movement position level of the nozzle unit such that the ends of the pair of nozzles reach the standby position level.

* * * * *